(12) United States Patent  (10) Patent No.: US 8,299,368 B2
Endo  (45) Date of Patent: Oct. 30, 2012

(54) INTERCONNECTION ELEMENT FOR ELECTRIC CIRCUITS

(75) Inventor: Kimitaka Endo, Yokohama (JP)

(73) Assignee: Invensas Corporation, San Jose, CA (US)

( * ) Notice: Subject to any disclaimer, the term of this patent is extended or adjusted under 35 U.S.C. 154(b) by 804 days.

(21) Appl. No.: 12/317,707

(22) Filed: Dec. 23, 2008

(65) Prior Publication Data

US 2009/0188706 A1  Jul. 30, 2009

(30) Foreign Application Priority Data

Dec. 25, 2007  (JP) ................................. 2007-332727

(51) Int. Cl.
*H05K 1/11* (2006.01)
(52) U.S. Cl. ........................................ 174/261; 257/737
(58) Field of Classification Search .......... 257/737–738; 174/261, 267
See application file for complete search history.

(56) References Cited

U.S. PATENT DOCUMENTS

| | | | |
|---|---|---|---|
| 5,587,342 A | 12/1996 | Lin et al. | |
| 6,216,941 B1 | 4/2001 | Yokoyama et al. | |
| 6,229,220 B1 | 5/2001 | Saitoh et al. | |
| 6,235,996 B1 | 5/2001 | Farooq et al. | |
| 6,335,571 B1 | 1/2002 | Capote et al. | |
| 6,648,213 B1 | 11/2003 | Patterson et al. | |
| 6,734,556 B2 | 5/2004 | Shibata | |
| 6,815,252 B2 | 11/2004 | Pendse | |
| 6,852,564 B2 | 2/2005 | Ohuchi et al. | |
| 6,869,750 B2 | 3/2005 | Zhang et al. | |
| 6,888,255 B2 | 5/2005 | Murtuza et al. | |
| 6,906,418 B2 * | 6/2005 | Hiatt et al. ..................... 257/738 |
| 6,956,165 B1 | 10/2005 | Hata et al. | |
| 6,965,166 B2 | 11/2005 | Hikita et al. | |
| 6,995,469 B2 | 2/2006 | Hatakeyama | |
| 7,125,789 B2 | 10/2006 | Tellkamp et al. | |
| 7,183,190 B2 | 2/2007 | Saijo et al. | |
| 7,214,887 B2 | 5/2007 | Higashida et al. | |

(Continued)

FOREIGN PATENT DOCUMENTS

EP  0615283 A1  9/1994

OTHER PUBLICATIONS

International Search Report, PCT/US2008/011271, dated Mar. 27, 2009.
U.S. Appl. No. 12/965,192.
U.S. Appl. No. 12/965,172.

*Primary Examiner* — Jeremy Norris
(74) *Attorney, Agent, or Firm* — Lerner, David, Littenberg, Krumholz & Mentlik, LLP

(57) ABSTRACT

An interconnection element and method for making same is disclosed. The interconnection element may include a plurality of metal conductors, a plurality of solid metal bumps and a low melting point (LMP) metal layer. The solid metal bumps overly and project in a first direction away from respective ones of the conductors. Each bump has at least one edge bounding the bump in at least a second direction transverse to the first direction. The low melting point (LMP) metal layer has a first face joined to the respective ones of the conductors and bounded in the second direction by at least one edge and a second face joined to the bumps. The edges of the bumps and the LMP layer are aligned in the first direction, and the LMP metal layer has a melting temperature substantially lower than the conductors.

31 Claims, 14 Drawing Sheets

U.S. PATENT DOCUMENTS

| | | |
|---|---|---|
| 7,382,049 B2 | 6/2008 | Ho et al. |
| 7,569,935 B1 | 8/2009 | Fan |
| 7,598,613 B2 | 10/2009 | Tanida et al. |
| 7,829,265 B2 | 11/2010 | Kitada et al. |
| 2006/0220259 A1 | 10/2006 | Chen et al. |
| 2007/0045869 A1 | 3/2007 | Ho et al. |
| 2009/0146303 A1 | 6/2009 | Kwon |

* cited by examiner

INTERCONNECTION ELEMENT FOR ELECTRIC CIRCUITS

The embodiments disclosed herein relate to an interconnection element to methods or processes for forming such interconnection elements. More particularly, the present embodiments relate to an interconnection element used for mounting electronic circuit components such as integrated circuit chips ("IC") for use in electronic apparatuses and to a method or process for forming such an interconnection element.

BACKGROUND OF THE INVENTION

It is well known in the art to use land grid array ("LGA") type connection as a method for connecting a semiconductor chip having a plurality of connecting terminals to a printed wiring board ("PWB") or a circuit panel, such as a printed circuit board ("PCB"), when it is desired to utilize use bumps in order to increase the mounting density of electronic circuitry. Bumps are normally formed on one face of the chip for electrical connection with the PWB. If an intermediate board, such as an interposer or a substrate is loaded with an IC so as to connect the IC to terminals or wirings on the PWB, bumps are often formed on one face of that interposer for securing electrical connection with the PWB.

In order to increase the density of circuitry on the PWB, a multilayered board, such as a build-up board, has been used. Using such PWB, an electronic circuit component is mounted on each face of a circuit board using, for example, face mount technology. Alternatively, in order to form conductive electric wirings between adjacent layers or between desired layers in the PWB, through holes called "vias" are provided for interlayer electric connection. The use of bumps for such interlayer connection is known. See, for example, JP 2002-359471 A.

Bumps can be formed, for example, by the screen-printing of conductive paste and by the use of metal such as copper or copper foil. Particularly, when bumps are formed using metal, the following steps are often used: A metal film ("metal layer") such as metal foil is disposed on one face of a semiconductor chip, an interposer or a single layer of the multilayered PWB (hereinafter generally referred to as "substrate"), and a predetermined pattern is formed with photoresist to be used as an etching mask. Then portions of the metal layer which are not covered by the photoresist are removed by etching with an acid or alkaline chemical solution ("etchant").

Often metallic terminals are provided on a substrate at portions where no bumps are formed. Thus, if bumps are formed by etching a metallic layer, it is necessary to take measures to protect these metallic terminals from any damage possibly caused by the etching process used for forming the bumps.

When copper or copper alloy is used to form connection bumps, it is known to control the depth of etching or the height of bumps, by using a metal, such as nickel, that is resistant to the copper etchant (see for example, JP 2002-359471 A, paragraphs [0020] to [0022]). Furthermore, JP 57-107501 A discloses a conductive paste containing gallium.

The use of a nickel layer that is resistant to the etchant to prevent etching damage to substrate terminals or wirings typically includes a structure that has a nickel layer between copper foil and a substrate on which terminals are formed, so as to avoid the unwanted etching of the copper.

Such a structure, however, requires a separate etching process to remove the nickel, and it becomes necessary to prevent bumps and any terminals or wirings located under the bumps from being damaged by this additional etching process.

To obtain such a structure, a nickel layer may be joined to terminals on the substrate by using a copper foil laminated with nickel, or disposing a nickel layer by plating on the substrate having terminals thereon, and then disposing a copper foil over the nickel layer. Such joining processes are often difficult to carry out.

In recent years, high impact resistance has been demanded for electronic circuitry. For this reason, if an interconnection element is used for mounting circuit parts, such as ICs, having a relatively large mass, high impact resistance is also required for BGA connecting portions which connect ICs or interposers to the PWB with solder balls. The joining process which satisfies such a requirement is difficult in practice so long as nickel is used.

The present embodiments have been achieved to solve at least some of the above-described problems.

BRIEF SUMMARY OF THE INVENTION

The present embodiments provide an interconnection element using a layer of a low melting point (LMP) metal as a foundation layer for bumps. Specifically, in one embodiment, an interconnection element and includes a plurality of metal conductors; a plurality of solid metal bumps and a low melting point (LMP) metal layer. The solid metal bumps overly and project in a first direction away from respective ones of the conductors. Each bump has at least one edge bounding the bump in at least a second direction transverse to the first direction. The low melting point (LMP) metal layer has a first face joined to the respective ones of the conductors and bounded in the second direction by at least one edge and a second face joined to the bumps. The edges of the bumps and the LMP layer are aligned in the first direction, and the LMP metal layer may be a melting temperature substantially lower than the conductors.

The interconnection element may be further connected to an IC chip, a dielectric element, a semiconductor-loaded intermediate board made of polyimide film or glass fiber reinforced resin, usually called an interposer or substrate in the electronic component mounting technology field, an element substrate which includes a circuit panel, such as a multilayered printed wiring board, a socket for mounting a semiconductor chip, a testing jig for securing a temporary connection for testing, and an encapsulant filled portion in which a semiconductor chip is embedded and sealed in an encapsulant on a circuit board for improving the mounting density.

The LMP metal in the context of the disclosed embodiments generally refers to a metal having a melting point which is sufficiently low to make it possible to form electric connection by melting. For example, it generally refers to any metal having a low melting point which allows it to melt at sufficiently low temperatures that are acceptable in view of the property of an object to be joined. Although the term "LMP metal" is sometimes used to generally refer to metals having a melting point (solidifying point) that is lower than the melting point of tin (about 232° C.=505 K), the LMP metal of the present embodiment is not always restricted to metals having a melting point lower than that of tin, but includes any simple metals and metal alloys that can appropriately bind to the material of the bump appropriately and that have a melting point temperature that parts for which an interconnection element is used for connection can tolerate. For example, for an interconnection element provided on a substrate using an insulation layer which has low heat resistance the melting point of the metal or metal alloy used according to the presently disclosed embodiments should be lower than the allowable temperature limit of the insulation layer.

If the interconnection element is joined to a semiconductor chip, such as an IC, the interconnection element may be electrically connected to another circuit board so as to form an electronic circuit by having the interconnection element connected to pads provided on the circuit board. If the interconnection element is joined to an interposer, the interconnection element of the present embodiments can be provided on a side that has no semiconductor chips mounted or at a peripheral portion of a side that is provided with semiconductor chips. If the interconnection element joins the interposer to another circuit board, bumps may be connected to another circuit board so that the interconnection element can be used to establish connection of semiconductor chips to the other circuit board. In order to join the interposer to a semiconductor chip mounted thereon, the interconnection element on the interposer may be directed to the semiconductor chip. If the interconnection element is joined to a substrate that serves as one layer of a multilayered PWB, the interconnection element of the present embodiments can be used for interlayer connection through via holes provided in a neighboring substrate when the supporting member is overlaid on the neighboring substrate to serve as part of the multilayered PWB. If the interconnection element is joined to a socket or a testing jig, the interconnection element may be connected to pads of a semiconductor chip to be mounted on the socket or testing jig and tested, and when the bumps are pressed to the pads, electrical connection is established.

The interconnection element according to the present embodiments is formed generally to establish an electrical connection through bumps as described above. The electrical connection includes joining of the bumps to a connecting portion provided on another circuit board by soldering and connecting the bumps to the connecting portion of another circuit board by pressing. The interconnection element disclosed by the present embodiments is not restricted to securing electrical connectivity between the supporting member and another circuit board or electronic circuit component, but also for any other purposes related to mounting and holding of electric and electronic circuits, such as increased mechanical mounting strength, improved heat radiation efficiency, higher mounting position accuracy, and improved interlayer connection for the formation of a multilayered PWB. Furthermore, the interconnection element can be used to increase the mounting density by increasing the number of connecting portions per area or length. Depending on each purpose, an appropriate means may be provided on the supporting member to secure electrical connection, improved mechanical mounting strength, efficient transmission of heat for heat radiation, and accurate positioning for mounting. For example, terminals are provided on the support member for electrical connection.

According to an embodiment of the present invention, a foundation layer may be comprised of a LMP metal. The LMP metal may be used under a metal from which a bump is to be formed. This foundation layer serves as an etching stop layer and a joining layer. Consequently, bumps having an excellent shape can be formed with reduce damages to the bumps themselves, terminals, or substrates. Furthermore, the bump made from a copper or copper-alloy foil may be joined to a terminal on the substrate, so as to form bumps having high mechanical strength and high connecting reliability. The joining of the bumps to the terminals can be realized relatively easily because the melting point of the foundation layer is low, so that an advantage associated with the joining of the bumps to the terminals achieved at a low cost.

A method of fabricating an interconnection element is also disclosed herein. Metal foil extending in first and second directions may be joined with a plurality of metal conductors and a low melting point layer separating the sheet from the conductors. The metal foil may be patterned to form a plurality of solid metal bumps extending away from the LMP metal layer in a third direction transverse to the first and second directions. The edges of the metal bumps in the first and second directions may be aligned with corresponding edges of the LMP metal layer, and the LMP metal layer may have a melting temperature substantially lower than the conductors.

In the various figures of this specification, the various layers of materials are not drawn to scale but rather are depicted in various thicknesses for clarity or convenience of depiction. Also, the lateral boundaries of the various wafer, interposer, conductive layers and/or other features show only a representative portion of a wafer scale package and will be understood by a person of skill in the art to be substantially replicated across the extent of a typical wafer.

DETAILED DESCRIPTION

A first embodiment will be described with reference to the accompanying drawings. The first embodiment is an interconnection element including a bump created on a pad provided on a substrate which can serve as a supporting member. In the embodiments discussed herein, tin or tin alloy may be used for a LMP metal layer.

Figure 1:
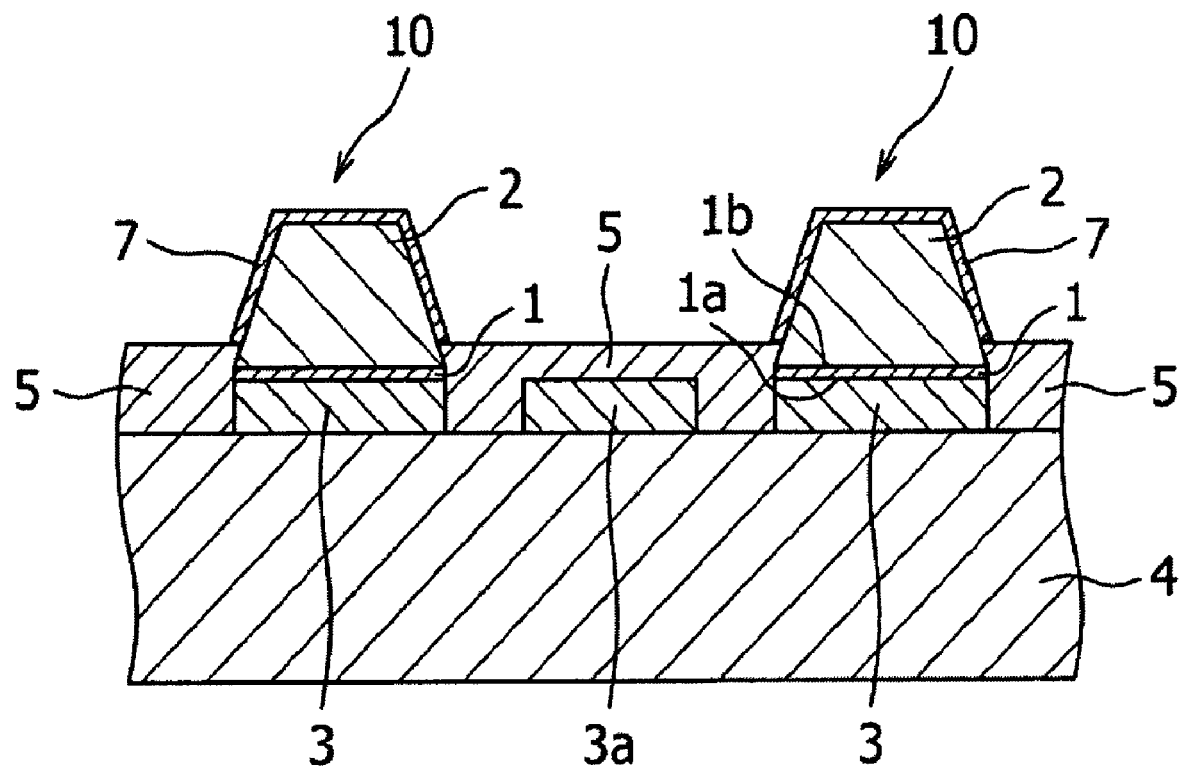
FIG. 1 is a cross-sectional view showing the configuration of an interconnection element according to an embodiment.

FIG. 1 is a sectional view of an interconnection element 10 that is joined to a substrate 4, such as a dielectric element. The interconnection element 10 has a metal layer, such as a tin metal layer 1 and a bump 2, which can, for example, be made of copper. It should be appreciated that "tin metal" includes pure tin as well as alloy whose main component is tin. The thickness of the tin metal layer 1 may be defined by an edge extending between the first face (surface) 1a and a second face 1b which can be connected to the bump 2. The first face 1a of the tin metal layer 1 may be in contact with a conductive metal, such as pad 3. The pad 3 has a thickness extending between top and bottom surfaces and may be formed on a substrate 4. The pad 3 extends in a direction perpendicular to the paper surface of the drawing as well as in the width direction (right-and-left direction) of the drawing. The substrate 4 may also have traces or wiring 3a made of the same metal as the pad 3.

On the top face of the substrate 4, a solder resist layer 5 may occupy a portion where the interconnection element 10 is present. A face of the bump 2 exposed from the solder resist layer 5 is provided with a surface treated layer 7, which may be created by nickel and gold plating.

The tin metal layer 1 of the present embodiment may be composed of any of tin, tin-copper, tin-lead, tin-zinc, tin-bismuth, tin-indium, tin-silver-copper, tin-zinc-bismuth and tin-silver-indium-bismuth. These metals have a low melting point and an excellent connectivity with respect to the bump 2 made of copper. Furthermore, if the pad 3 is created of, for example, a copper layer, the tin metal layer 1 has an excellent connectivity with respect to the pad 3. In this embodiment, tin may be used for the tin metal layer 1. The composition of this tin metal layer 1 does not always need to be uniform. For example, the tin metal layer 1 may be a single layer or multilayered. Furthermore, the tin metal layer 1 can form a solid solution with the material of the bump 2 or the pad 3 so that the composition ratio changes gradually at one or both of the interface with the pad 3 (first face 1a) and the interface with the bump 2 (second face 1b). Alternatively, the compositions of the tin metal layer 1, pad 3 and bump 2 undergo metallurgical segregation or aggregation at their interfaces or between them, although the tin metal layer 1 has a single composition when it is created, so as to have variable compositions.

Generally the bump 2 refers to a solid structure which can be projected from a face on which the bump is formed to have a convex shape. Its bottom face, which has a circular and larger area, is in contact with the tin metal layer 1, and its top face (apex), which has a smaller and also circular area, is raised from the substrate 4. The shape of the bump 2 is rather arbitrary and may be not only a truncated cone (a part of a cone whose top portion is cut off along a face parallel to its bottom face) shown in the drawings, but also of a cylinder or a cone or any other similar shape known in the art, such as a cone with round top or a plateau shape. Furthermore, in addition to the three dimensional (3D) shape having a circular cross-section, which is called a "solid of revolution", such as the truncated cone, the bump 2 may have an arbitrary shape such as any three dimensional shape having a polygonal horizontal cross-section. Typically, the shape can be adjusted by changing the resist pattern, etching conditions or the thickness of the original layer from which the bump 2 is formed. Although the dimensions of the bump 2 are also arbitrary and are not limited to any particular ranges, often, it may be formed to project from the face of the substrate by 10 to 500 micrometers, and if the bump has the circular cross-section, the diameter may be set in a range of 0.1 to 10 mm. The material of the bump 2 may be copper or copper alloy. The copper alloy includes an alloy of copper with any other metals.

The bumps each have an edge 100 that bounds the periphery of the bump. In this embodiment, due to the conical-shaped bump, there is a base edge 100' that extends around the circumference of the bottom portion of the bump which is in contact with the tin metal layer 1. It is to be appreciated that the base edge 101' is one continuous edge due to the circumference of the bump. However, a bump in the shape of a square or the like may have more than one edge. Similarly, the tin metal layer also has an edge that bounds its periphery. At the conclusion of the etching process, each of the edges 100, 101 may be substantially aligned with one another so as to create one continuous edge between the edge 101 of the tin metal layer 1 and the base edge 100' of the bump portion adjacent the tin metal layer 1c.

If the interconnection element 10 of this example is provided for the purpose of electrical connection, the pad 3 may be used for such a purpose. Generally, a terminal may refer to a pad for mounting an electronic component or a part, and may include a conductive portion not used for mounting, such as an intermediate portion for wiring, a grounding line, a shield line. These terminals may conduct signals or electricity transmitted to or from an IC. Although according to this embodiment, the interconnection element 1 is provided only on one side of the substrate 4 as shown in FIG. 1, the present alternate embodiments may cover various configurations. For example, in addition to the configuration in which the interconnection element 10 is formed on one face, the interconnection element 10 may be formed on the opposite faces, and the interconnection element 10 may be formed on a surface at a portion of the substrate and on the other surface at a different portion of the substrate.

Figure 2A:
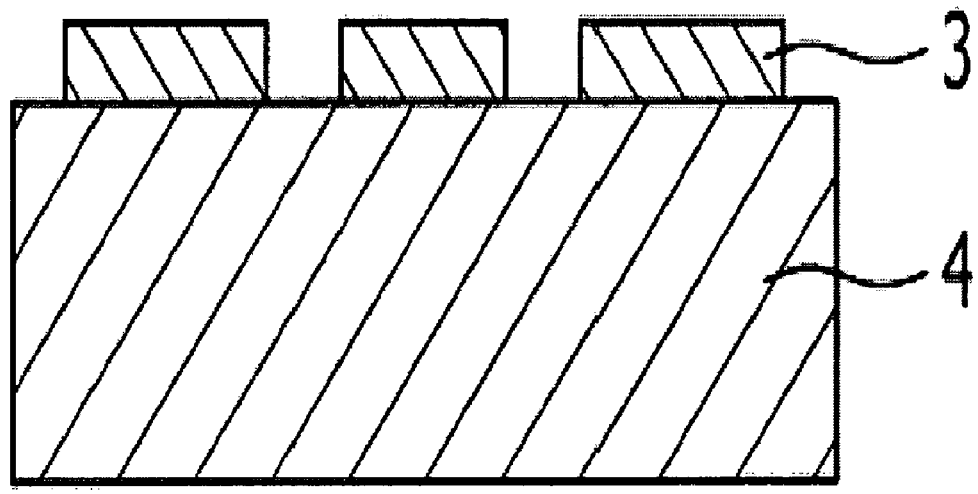
FIGS. 2A, 2B, 2C, and 2D are cross-sectional views showing method steps for making interconnection element in accordance with the embodiment of FIG. 1.
Figure 2B:
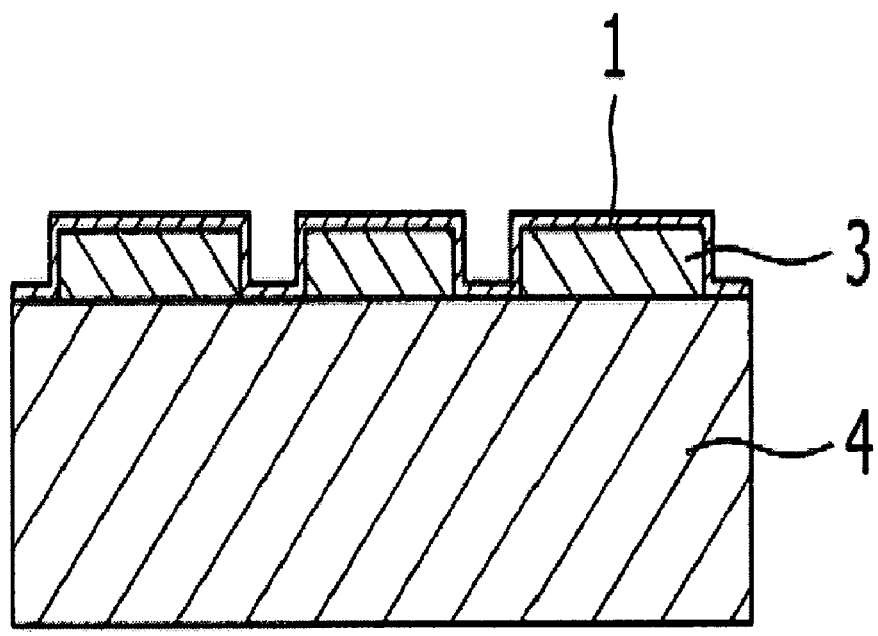
Figure 2C:
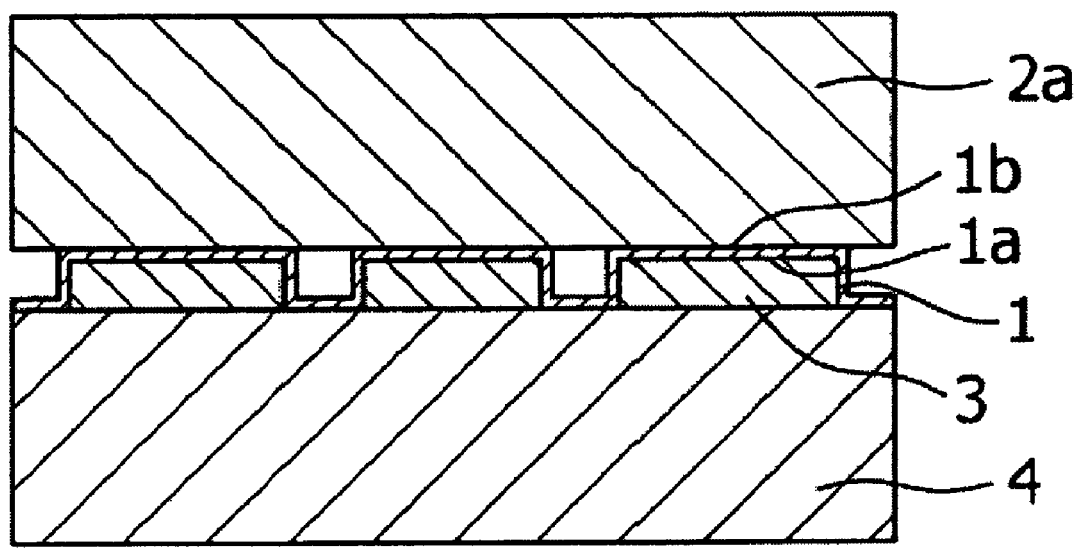

Referring to FIGS. 2A to 3H, a method for manufacturing the interconnection element 10 shown in FIG. 1 will be described. FIGS. 2A to 3H are cross-sectional views showing a structure at each stage of the process for manufacturing the interconnection element 10. At the outset, a metal foil, such as a copper foil may be laminated onto one face of the substrate 4 and patterned so as to form a metal conductor, such as pad 3, and a wiring 3a (FIG. 2A). Next, a low melting point metal layer 1 may be disposed on the substrate 4 by electroless plating with tin (FIG. 2B). In the embodiments disclosed herein, in addition to the electroless plating, other techniques such as electrolytic plating, displacement plating, solder leveler technique, or cladding may be used. If a solder leveler is used here, copper foil is brought into contact with melted solder by immersion in a solder bath or coating with the melted solder, and the solder may be smoothed or leveled by hot air. The cladding refers to a process of joining a copper foil and a tin foil by rolling with pressure, or a process of cleaning the joining face of the copper or tin foil by a sputtering process with argon ion (reverse sputtering process) in a vacuum chamber and then joining them under pressure at a normal temperature. These plating methods can also be used when an alloy is used for the tin metal layer. The thickness of the tin metal layer 1 may be 10 micrometers or less, including 1 micrometer or less, such as, for example, 0.3 micrometers.

A metal foil may be brought into contact with the tin metal layer 1 (FIG. 2C) and subsequently made into bumps 2. The metal foil may be a copper foil 2a, but it should be appreciated that other types of metal known in the art may be utilized. The copper foil 2a can be united with the tin metal layer 1 by a procedure similar to soldering by heating the substrate 4 on which the copper foil 2a is placed in a reflow furnace. Alternatively, the side of the copper foil 2a facing toward the substrate 4 and the face of the tin metal layer 1 may be cleaned by reverse sputtering in a vacuum chamber, and they may be pressed together under a vacuum condition in the vacuum chamber. Consequently, the tin metal layer 1 with the lower face 1a as a first face and the upper face as a second face 1b may be disposed in contact with the pad 3 at the first face 1a and in contact with the copper foil 2a at the second face 1b, so as to have an assembly comprising the pad 3 as a supporting metal layer, the tin metal layer 1, and the copper foil 2a.

Figure 2D:
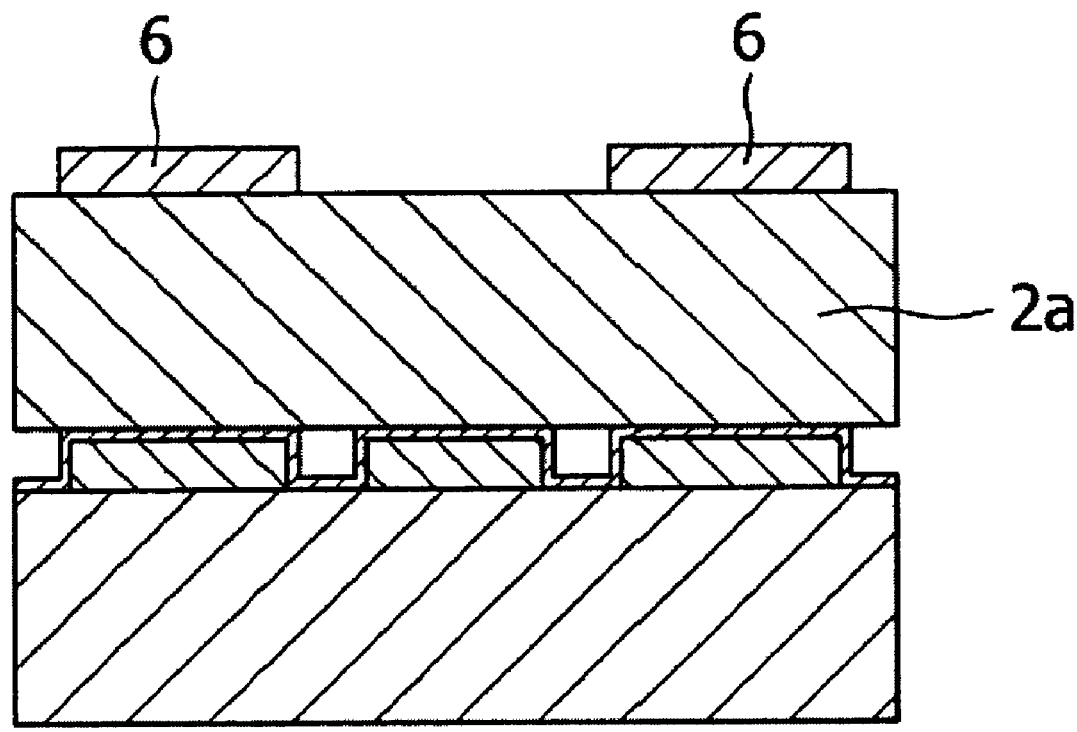

An etching resist layer may be formed on the face of the copper foil 2a and in one embodiment, the resist layer may be exposed to light according to a predetermined pattern, developed, and baked so as to form a resist pattern 6 (FIG. 2D). The resist pattern 6 may be provided at a position corresponding to the top portion of the pad 3. This resist pattern may be formed using any type of resists available for use in the formation of metallic patterns for printed wiring boards. A film-like resist such as dry film resist (DFR) and a liquid-type resist which forms a film when it is applied with a spin coater or a bar coater may well be used. These resists may be baked by appropriate heating, exposed to ultraviolet light having an illumination distribution of a predetermined pattern generated by a photo mask, and developed so as to form a resist pattern 6.

Figure 3E:
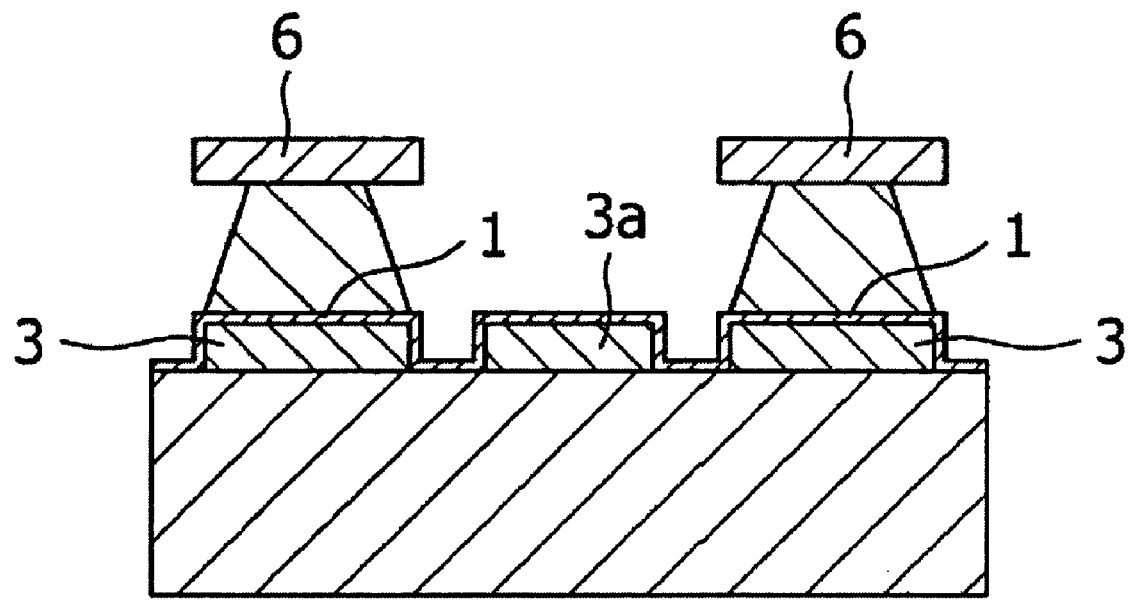
FIGS. 3E, 3F, 3G, and 3H are cross-sectional views showing additional process steps for making the interconnection element in accordance with the embodiment of FIG. 1.

After the resist pattern 6 is formed, the etching processing of the copper foil 2a may be carried out. This etching processing of the copper foil 2a may be carried out with mixing an aqueous solution composed of 20 to 30% by weight of copper ammonium complex salt, 10 to 20% by weight of ammonium chloride, and 1 to 10% by weight of ammonia as an etching solution (etchant) having an alkaline property. Because this etching may be isotropic etching like other wet etching mechanisms, the etching progresses in an in-plane direction (for example, a right-left direction in the drawings) as well as in the thickness direction of the copper foil 2a, so that the copper foil 2a is turned into truncated cones according to the etching pattern 6 so as to form the bumps 2 (FIG. 3E). At this time, the tin metal layer 1 may be exposed to the etchant, but this tin metal layer 1 is not etched by the alkaline etchant for use in this embodiment. Thus, the pad 3 and the wiring 3a located thereunder are not etched. As well as the etchants described here, it is permissible to use an arbitrary etchant whose etching rate per unit time is relatively high with respect to copper or copper foil which is turned into the bumps 2 and whose etching rate with respect to the tin metal is relatively low or which is incapable of etching the tin metal.

Figure 3F:
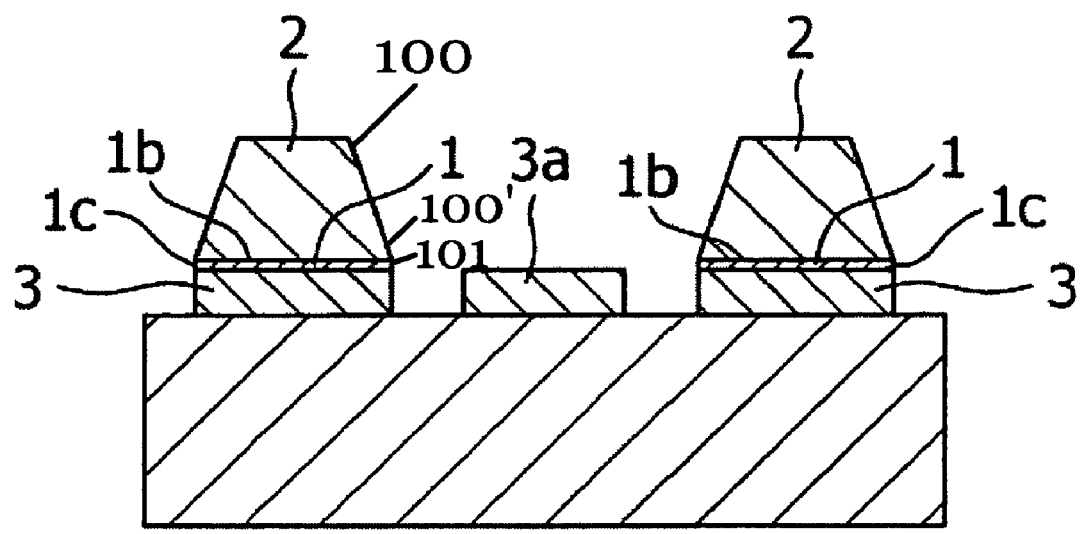

The etching resist pattern 6 may be removed with an ordinary alkaline remover solution (typically, 3-6 sodium hydroxide aqueous solution), and the tin metal layer 1 may be removed while the bumps 2 are used as a mask (FIG. 3F). Consequently, a periphery 1c of the tin metal layer 1 may be defined such that it corresponds to the shape of the bump 2. The tin metal layer 1 disposed in contact with the wiring 3a may be removed. In etching of the tin metal layer 1, aqueous solution containing 10% of sodium persulfate which is an acid etchant may be used. The etchant for use in etching of this tin metal layer 1 has a low etching rate with respect to the material of the bump 2 or is incapable of etching it, and has a higher etching rate with respect to the tin metal layer 1 than with respect to the bump 2 (copper foil 2a). In the meantime, instead of the above-mentioned alkaline removing liquid, the resist pattern 6 can be removed with a neutral organic amine-based aqueous solution as well.

During a trial on this treatment carried out by the present inventors, the tin metal layer 1 could not often be removed well by the acid etchant alone. As a reason for this, it has now been determined that areas having relatively high copper concentrations are formed as a thin layer or somehow locally between the first face 1a and the second face 1b within the tin metal layer 1. FIG. 8 illustrates the face of the tin metal layer 1 at each stage of etching treatment of the tin metal layer 1. These samples are obtained without etching bumps from the copper foil 2, but by joining a copper foil with a copper foundation layer using a tin metal layer through the use of the same processing as the one used to treat the tin metal layer 1 and by etching the copper foil.

Figure 8A:
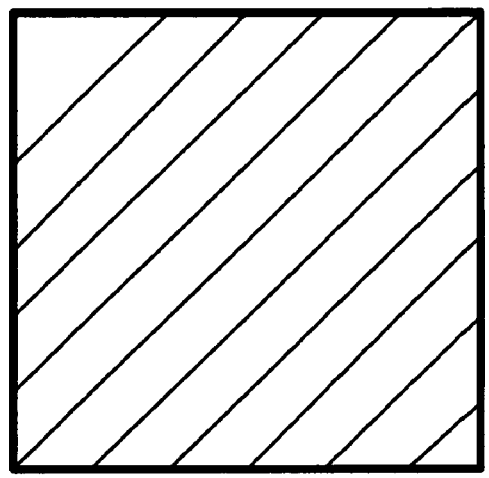
FIGS. 8A, 8B, and 8C show the face of each layer which appear when a tin metal layer is etched in an experimental embodiment.
Figure 8B:
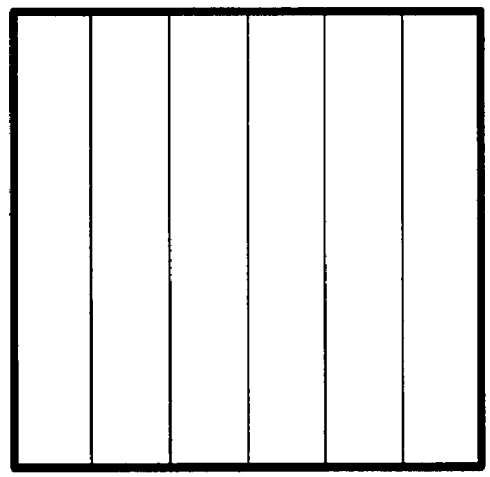
Figure 8C:
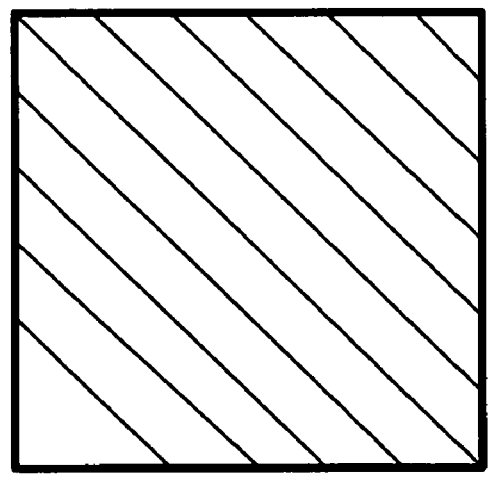

When the copper foil is removed (at the stage depicted in FIG. 3E), the tin metal is exposed on the face (FIG. 8A). The exposed face has a color of the tin metal (silver gray), as represented by the cross-hatchings in FIG. 8A which are angled upwardly from the left of the border to the right. When the tin metal is etched with an acid etchant, a layer having a copper color appears (FIG. 8B), as represented by the cross-hatchings in FIG. 8B which extend from top to bottom of the border. Because this layer cannot be etched by the acid etchant for the tin metal, the etching stops at this layer, although the tin metal still remains in a section up to the copper layer of the foundation. This copper layer is one of the layers of copper diffused and segregated in the tin metal layer as it can be recognized easily by its color. Thus, if this copper layer is etched with an alkaline etchant, the tin metal layer appears again (FIG. 8C), as represented by the cross-hatchings, which are angled upwardly from the right of the border to the left. Because the tin metal layers and copper layers appear alternately within the layer which has initially been formed as the tin metal layer 1, and etching stops each time when the alkaline or acid bath is used. If two different etchant baths are used so as to etch alternately in each bath, the tin metal layer 1 can be removed altogether.

Although the formation process of the bump depends on reflow conditions for joining the copper foil 2a to the wiring 3 by means of the tin metal layer 1, thin layers of high copper concentrations exist even if the tin metal layer 1 is initially made of tin. The number of such high copper concentration layers may typically be five to seven. If the tin metal layer 1 cannot be removed easily, such copper components can be removed using a soft etchant for copper. This soft etchant may be used a number of times corresponding to the number of thin layers having a high copper concentration. During the etching process with the acid etchant for removing the tin metal layer 1, the acid etching may be interrupted a number of times corresponding to the number of the layers, and immersion into the soft copper etchant may be repeated. As an example of the soft etchant for copper, it is possible to use a mixed solution of hydrogen peroxide or persulfate, an inorganic acid, and an organic acid having two or more carboxyl groups.

Figure 3G:
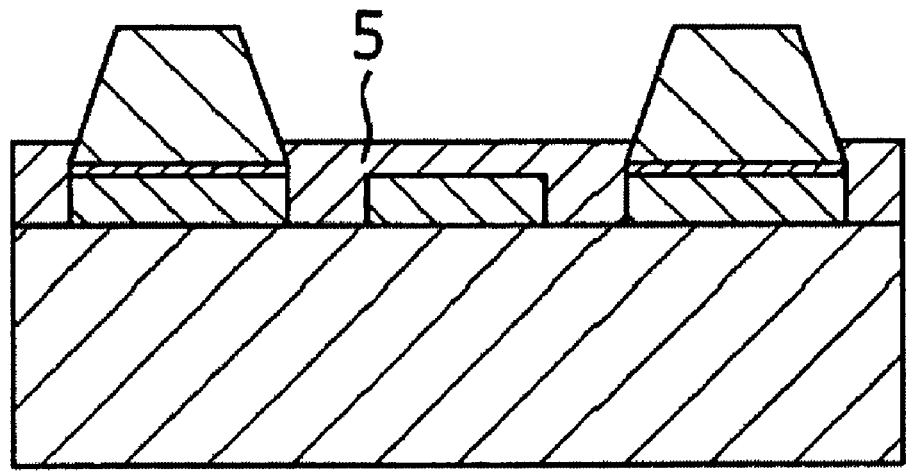
Figure 3H:
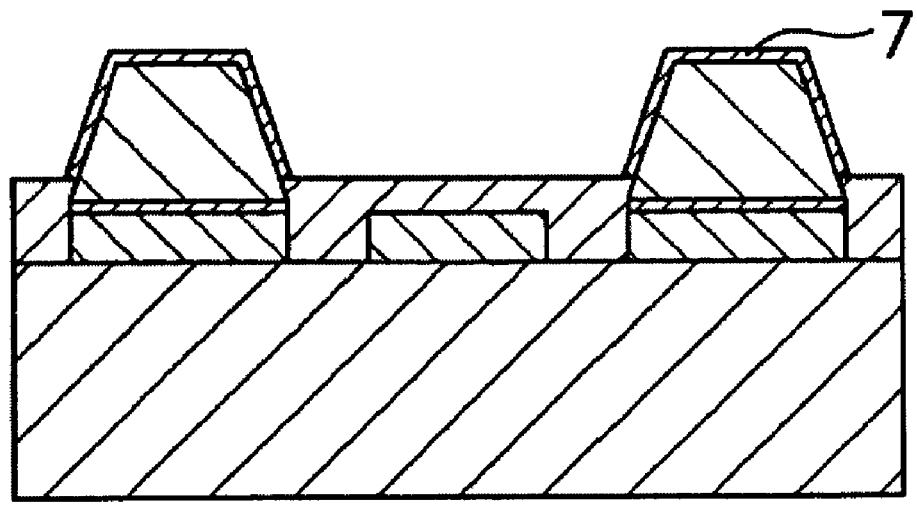

After the etching resist 6 and the portions of the tin metal layer 1 are removed, the solder resist layer 5 is formed (FIG. 3G). The solder resist layer 5 can be formed by any method, such as screen printing, lithography, or attaching a dry film. Finally, a nickel-gold layer 7 is formed on exposed portion of the bumps 2 by electroless nickel plating and electrolytic gold plating.

Figure 4:
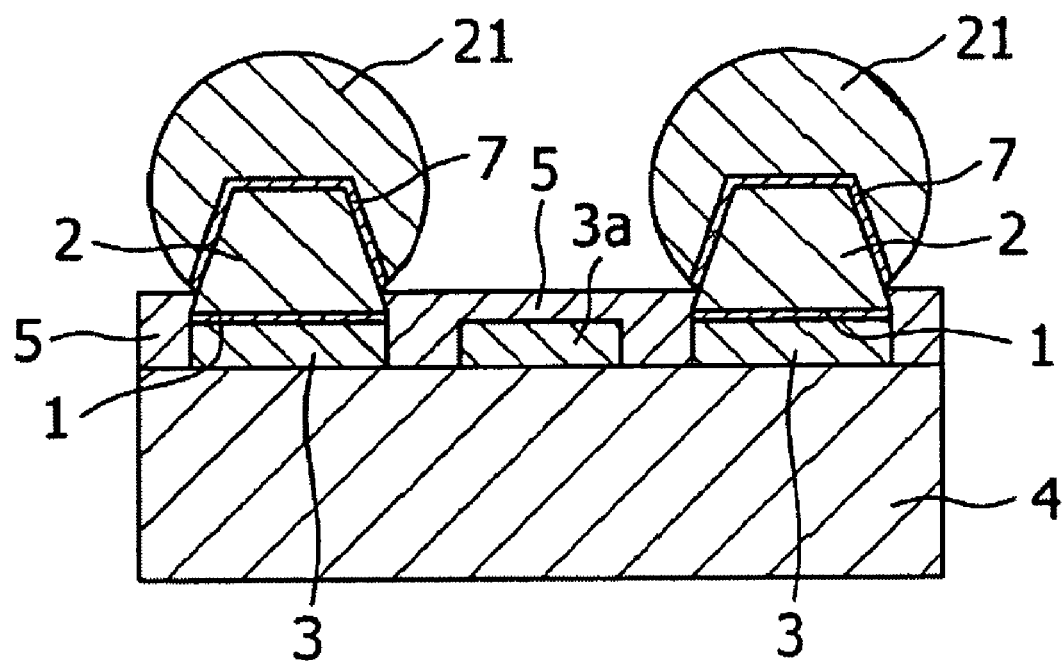
FIG. 4 is a cross-sectional view showing the configuration of the interconnection element according to an alternate embodiment in which solder balls are used.

Turning next to a second embodiment shown in FIG. 4, electric connection may be achieved using the interconnection element 10 produced according to the first embodiment. In this embodiment, the bumps may be connected to another electronic circuit board or electronic component using solder balls.

Still referring to FIG. 4, solder balls are shown provided on the bumps. The solder ball 21 may be placed on the bump 2 and maintains a spherical shape with face tension. This solder ball 21 may be formed by disposing solder onto the bump 2 according to, for example, screen printing, and then, by melting solder alloy contained in the solder so as to cover the surface portion of the bump 2 that is exposed from the solder resist layer 5. Solder ball 21 can extend toward the upper surface of solder resist layer 5, but remains out of contact with pad 3, as any portion of pad 3 that is not covered by bump 2 is covered by solder resist layer 5. Further, solder resist layer 5 can extend upwardly along and in substantial contact with a portion of the edge surface of bump 5. Nickel-gold layer 7 can cover a portion of bump 2 that is exposed above solder resist layer 5 and can further overly a portion of solder resist layer 5.

The solder ball 21 may be heated when the solder ball is formed and also when the bump 2 is connected to another circuit board or electronic circuit components through the solder ball 21 by soldering at the time of reflow connection process. The material for the tin metal layer 1 may be selected so that it does not melt under temperatures for such reflow connection process. For example, if the solder ball 21 is made of a tin eutectic solder, the tin metal layer 1 should be composed of tin. At temperatures when the solder ball 21 is formed or when the solder ball 21 is melted for connection by soldering, the tin metal layer 1 should not melt.

FIG. 5, a third embodiment, shows a method of manufacturing a multilayered printed circuit board using the construction discussed in the first embodiment except for the use nickel-gold layer 7. FIGS. 5A-5E are cross-sectional views showing a method of manufacturing the multilayered printing circuit board in accordance with the present embodiment. A substrate 44 (FIG. 5E) is used as a substrate. A metal portion composed of a foundation layer 41 and a conductive layer 43 (FIG. 5C) may disposed on the substrate 44.

Figure 5A:
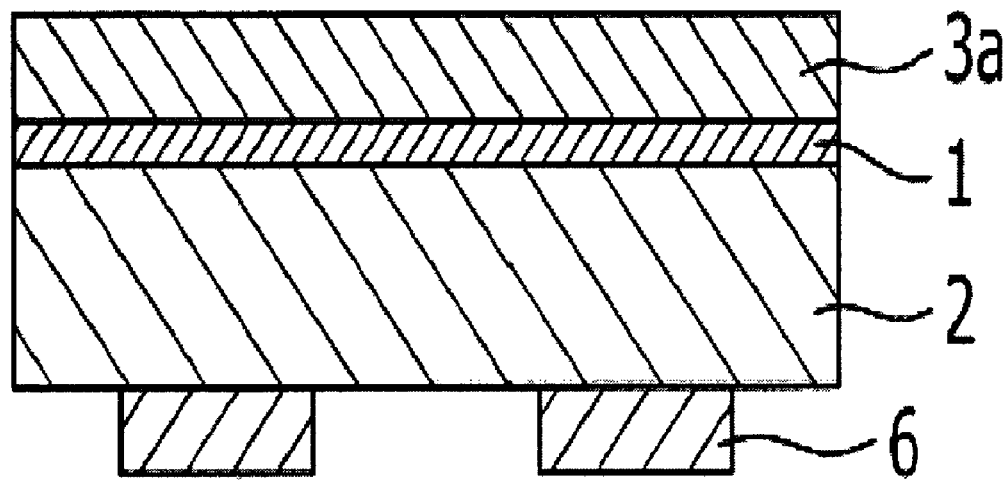
FIGS. 5A, 5B, 5C, 5D, and 5E are cross-sectional views showing steps for manufacturing the interconnection element according to another embodiment.

Referring to FIG. 5A, the wiring layer 3a may serve as a supporting member. An assembly in which the wiring layer 3a, the tin metal layer 1 and the copper foil 2a are stacked may be prepared and the etching resist 6 may be formed on the face of the copper foil 2a (FIG. 5A). The assembly may be produced by forming the tin metal layer 1 on the metallic wiring layer 3a by electroless plating, electrolytic plating or displacement plating and joining the copper foil 2a thereto like the embodiment shown in FIG. 2B. Conversely, the assembly may be produced by forming the tin metal layer 1 on the copper foil 2a by electroless plating, electrolytic plating or displacement plating, and by joining the wiring layer 3a thereto. In any case, the assembly may be constructed with or without pressing or by pressing with heating so as to melt the tin metal layer 1.

Figure 5B:
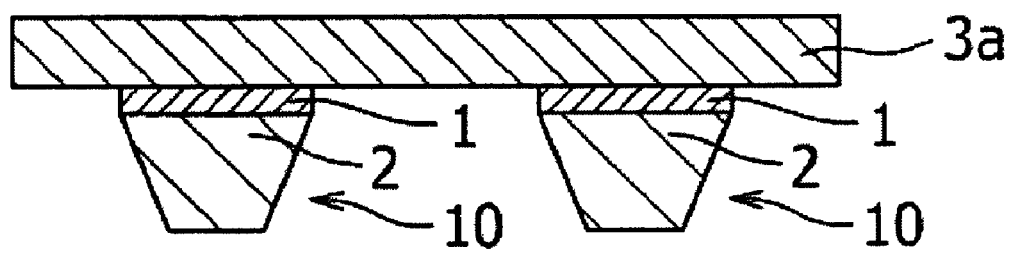
Figure 5C:
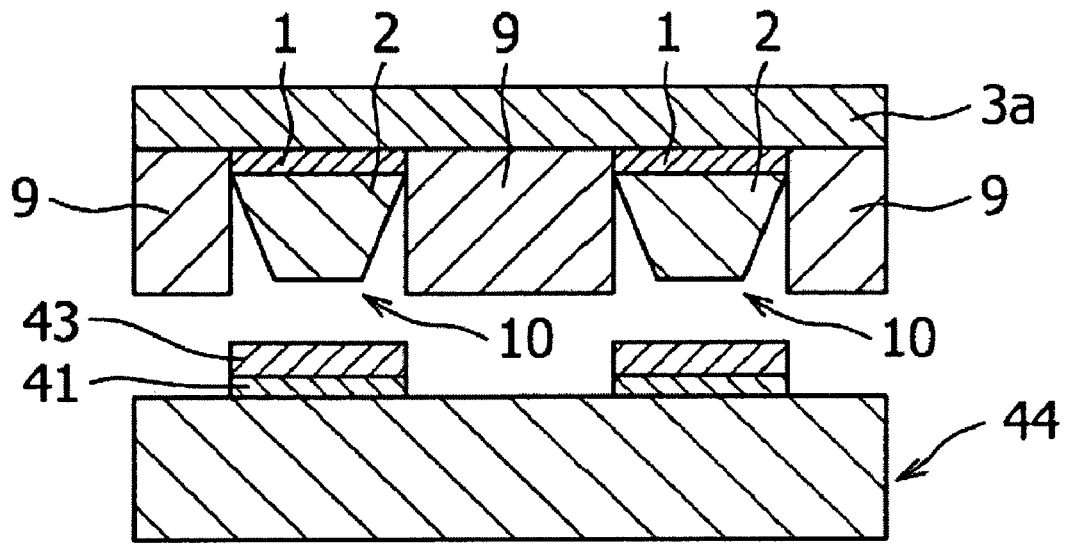
Figure 5D:
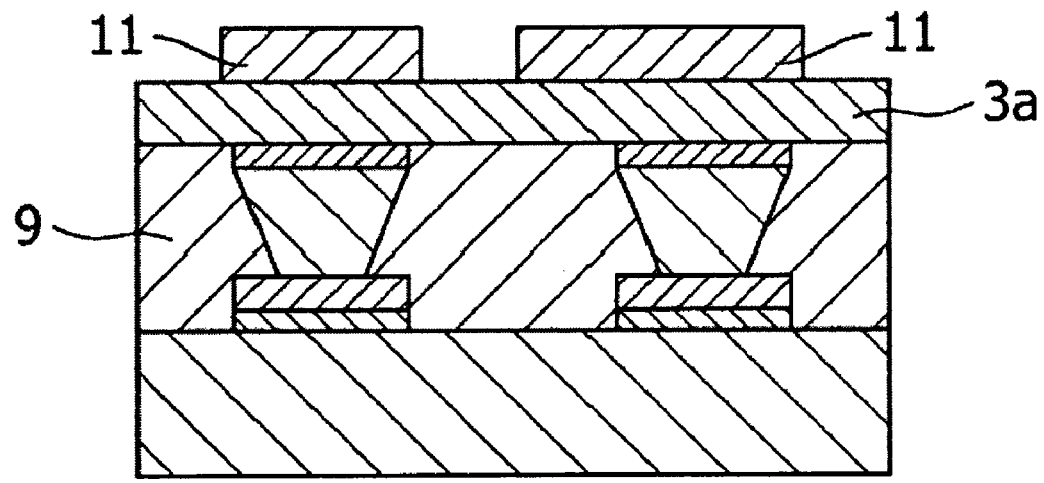
Figure 5E:
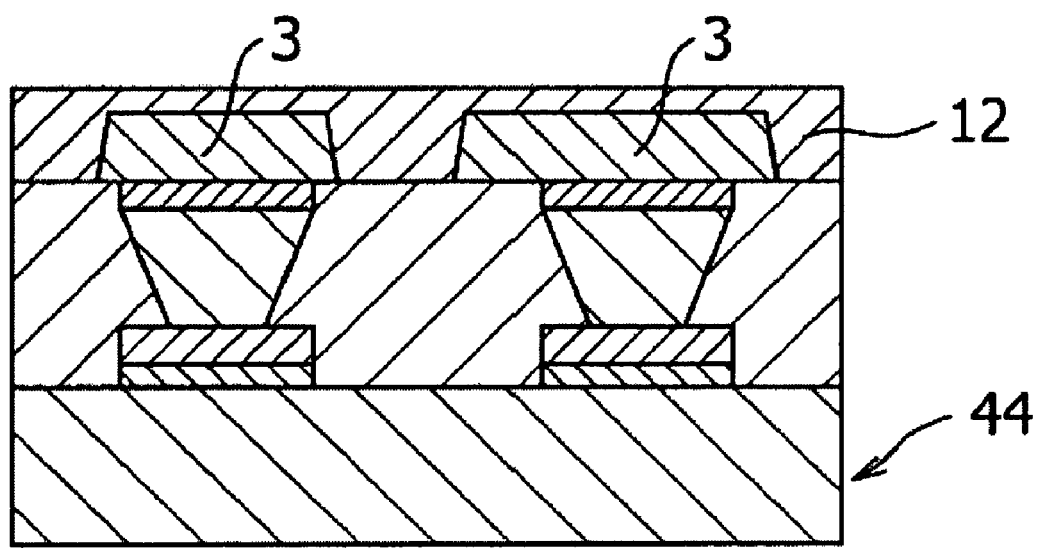

The bump 2 is formed in the same manner as in the first embodiment and the tin metal layer 1 is etched, so as to form the interconnection element 10 in which the wiring layer 3a is held as a supporting member (FIG. 5B). Thermosetting resin 9, which turns into an insulation layer, may then be disposed on a portion in which no bump structure 10 is formed (FIG. 5C). The assembly may be positioned on a substrate 44 so that the position of the bump is aligned with the position of the metal portion and with the interconnection element 10 facing the substrate 44, the entire assembly is pressurized and heated, thereby integrating the assembly and the substrate 44 being integrated (FIG. 5D). An etching resist 11 for forming the pad 3 into a predetermined pattern from the wiring layer 3a is formed on the wiring layer 3a. Using the etching resist 11, etching may be carried out, so that the pad 3 is patterned from the wiring layer 3a. A solder resist 12 is formed on a face on which the pad 3 exists as a protection layer 12 (FIG. 5E). Consequently, there is provided an interconnection element in which the pad 3 and a metal terminal are connected electrically to another circuit board.

Figure 6A:
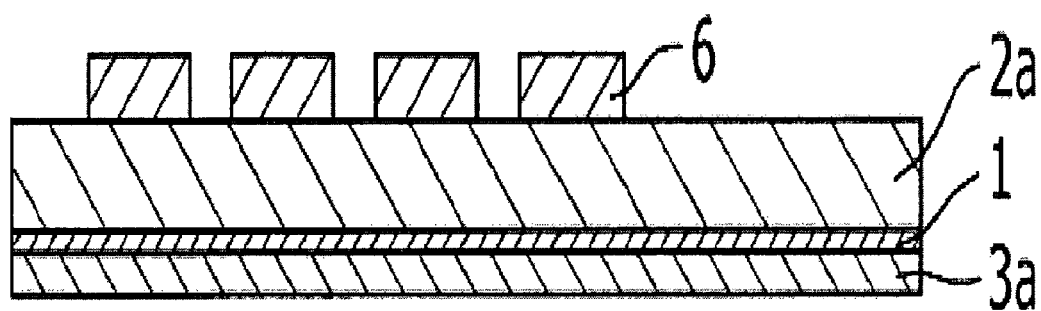
FIGS. 6A, 6B, 6C, 6D, and 6E are cross-sectional views showing steps for manufacturing the interconnection element according to another embodiment.
Figure 6B:
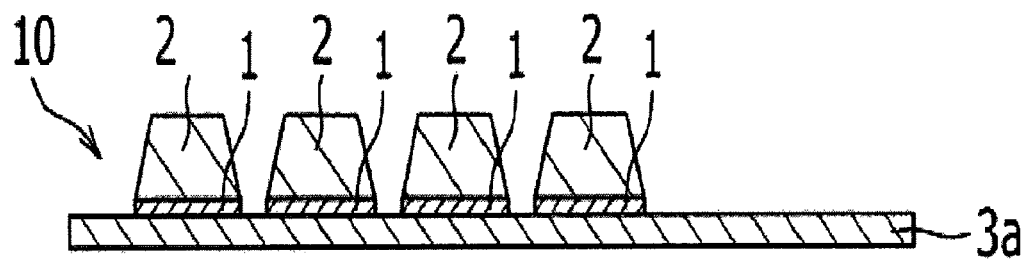
Figure 6C:
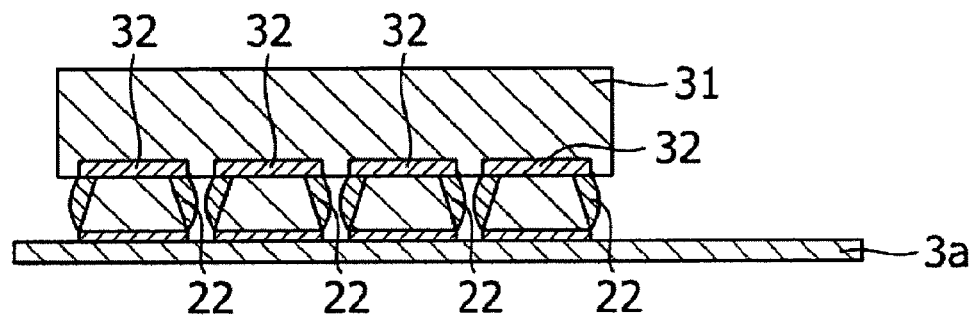
Figure 6D:
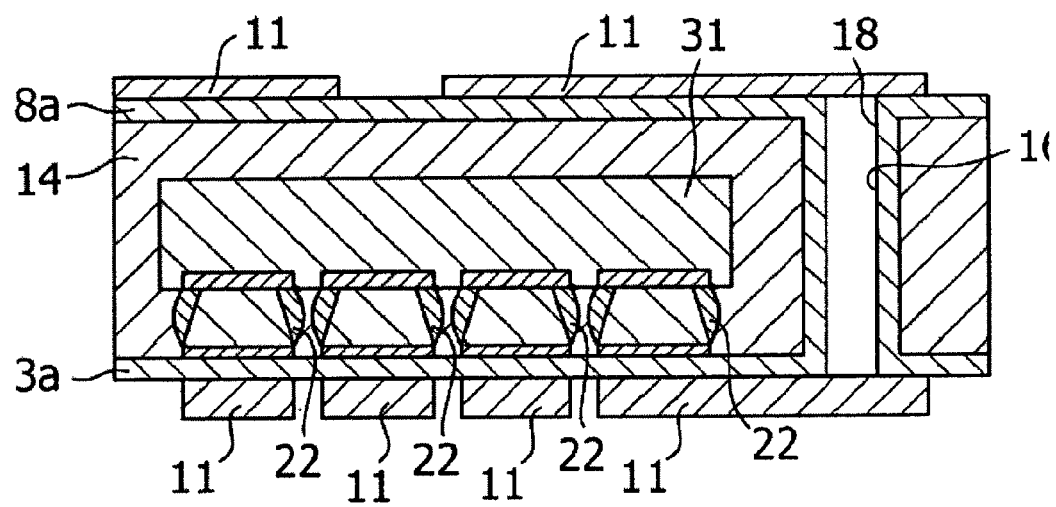

FIGS. 6A-6F, a fourth embodiment of the interconnection element, show the method steps as to how the interconnection element is created and connected to an external circuit chip or the like. The interconnection element includes bump structure 10 (FIG. 6B), which includes metal bumps 2, a low melting point metal layer, such as tin layer 1, and a wiring layer 3a that is capable of providing interconnection to another electronic element or the like. The wiring layer 3a may be held by a charged encapsulant, such as a resin portion 14, which acts as an insulating portion or layer (FIG. 6D). According to this embodiment, the assembly in which the wiring layer 3a, the tin metal layer 1 and the copper foil 2a are stacked is prepared, and the etching resist 6 is disposed on the wiring layer 3a (FIG. 6A). Following the pattern of the etching resist 6, the copper foil 2a may be etched so as to form the bump 2. With the bump 2 used as a mask, the tin metal layer 1 is etched so as to obtain the interconnection element 10 (FIG. 6B). In this bump structure, the periphery of the tin metal layer 1 is defined corresponding to the shape of the bump 2. Furthermore, the bump 2 has a base with an edge bounding the base that is aligned with the edge of the etched tin metal layer 1. Here, nickel and gold may be applied for plating so as to form a protection layer, although this is not shown.

The interconnection element may be connected to an integrated circuit chip (semiconductor die) 31 having a connection pad 32 at a position corresponding to each apex of the bump 2 and solder 22 that may be formed on the connection pad 32 preliminarily. The solder may be deposited using solder plating or printing, or methods known to those skilled in the art. The integrated circuit chip 31 is connected to the interconnection element by positioning the integrated circuit chip 31 such that the bumps 2 coincide with the apexes for the bumps 2 and the integrated circuit chip 31 may be pressed under a heated condition, so that the pad 32 and the bumps 2 are joined together through the solder 22 (FIG. 6C).

A space on the integrated circuit chip 31 side of the wiring 3 is filled with the charged resin 14 and for wiring copper foil 8a may be bonded to a face on the opposite side to the wiring layer 3a of the charged resin 14 through an adhesive layer. After that, a via hole 16 may be provided such that it penetrates the wiring copper foil 8a, the charged resin 14, and the wiring layer 3a, and interlayer connecting wiring 18 may be formed on an inner face of the via hole 16 by plating with nickel. Furthermore, an etching resist 11 having a predetermined pattern may be formed on the surface of the wiring layer 3a and the wiring copper foil 8a (FIG. 6D).

Figure 6E:
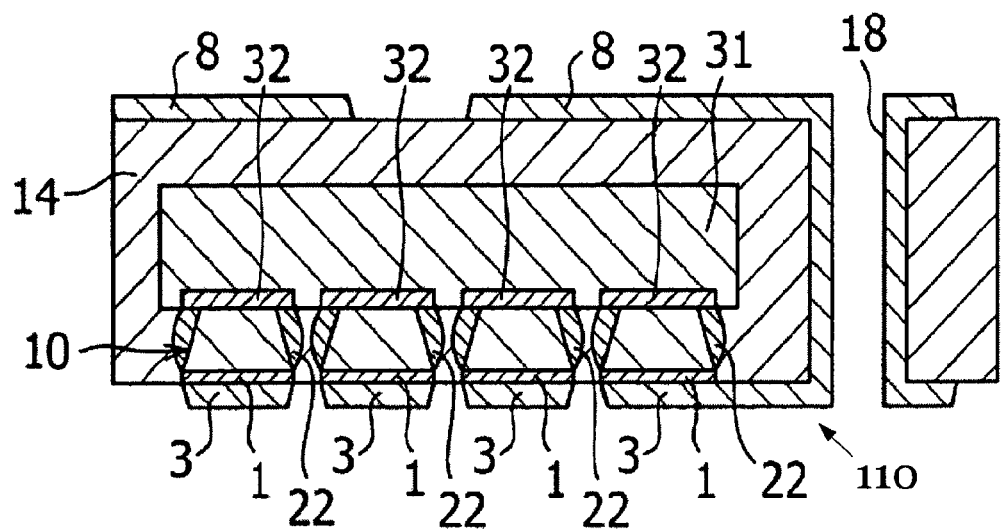

As a result of etching the wiring layer 3a and the wiring copper foil 8a, according to a pre-determined pattern for the etching resist 11, the pad 3 connected to the connection pad 32 on the integrated circuit chip 31 through the interconnection element 10 and the wiring 8 provided on a face on an opposite side to the face on which the pad 3 exists are connected to each other through the via hole 18 as required (FIG. 6E). By disposing the solder resist layer appropriately for controlling an adhering position of solder as required, although this is not shown, and executing electroless nickel plating and electroless gold plating, the faces of the wiring 8 and the pad 3 can be processed.

By devising the pattern of the etching resist 11 at the stage shown in FIG. 6D, it obviates the need to have corresponding pads 3 at some bump structures 10 (not shown). This allows the tin metal layer 1 to act as an etching stop layer against etching for the wiring layer 3a. Because in such a configuration for exposing the tin metal layer 1, the topmost face of an electrode leading to the interconnection element may be the tin metal layer, excellent soldering connectivity can be obtained even if no special face treatment is carried out. By forming the bump further on the exposed tin metal layer 1 according to the process of the present disclosed embodiment, the bumps may be stacked.

Figure 6F:
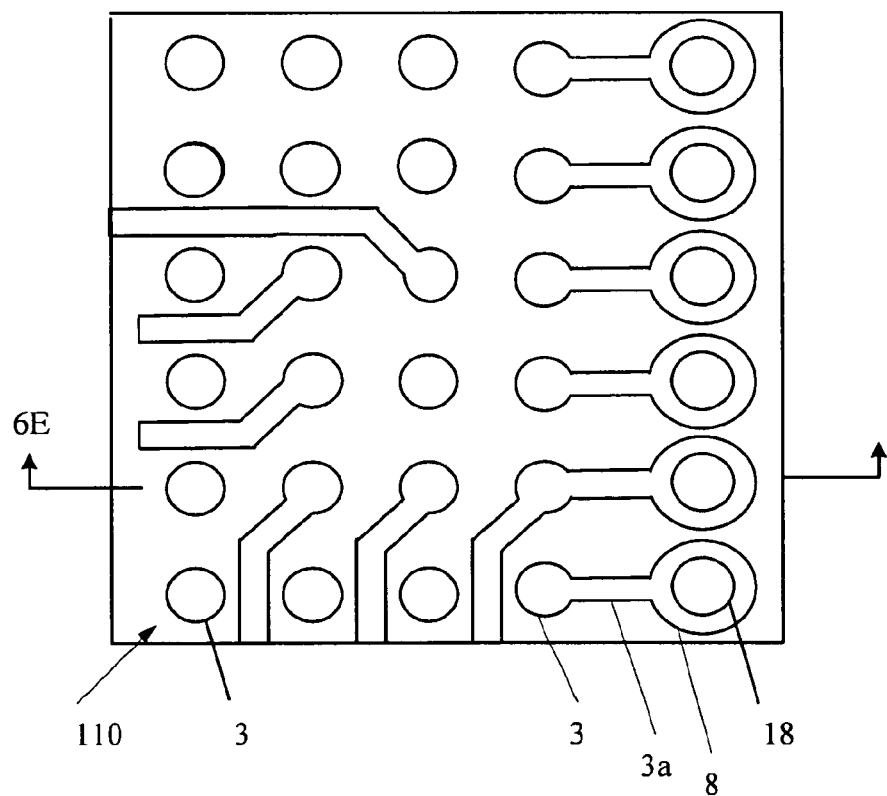
FIG. 6F is a plan view of the bottom surface of FIG. 6E.

Referring to FIG. 6F, a plan view of the bottom surface 110 of FIG. 6E is shown. FIG. 6F shows pads 3, the via 8, wiring foil 3a, and interconnect wiring 18.

This embodiment shows a configuration in which the integrated circuit chip is sealed by the charged resin 14. Use of an interposer for mounting the integrated circuit chip to other electronic circuit board can be realized by connecting the interconnection element of the first embodiment as shown in FIG. 1 to pads (the same as the pads 32 in FIGS. 6C to 6E) provided on the integrated circuit chip.

Figure 7:
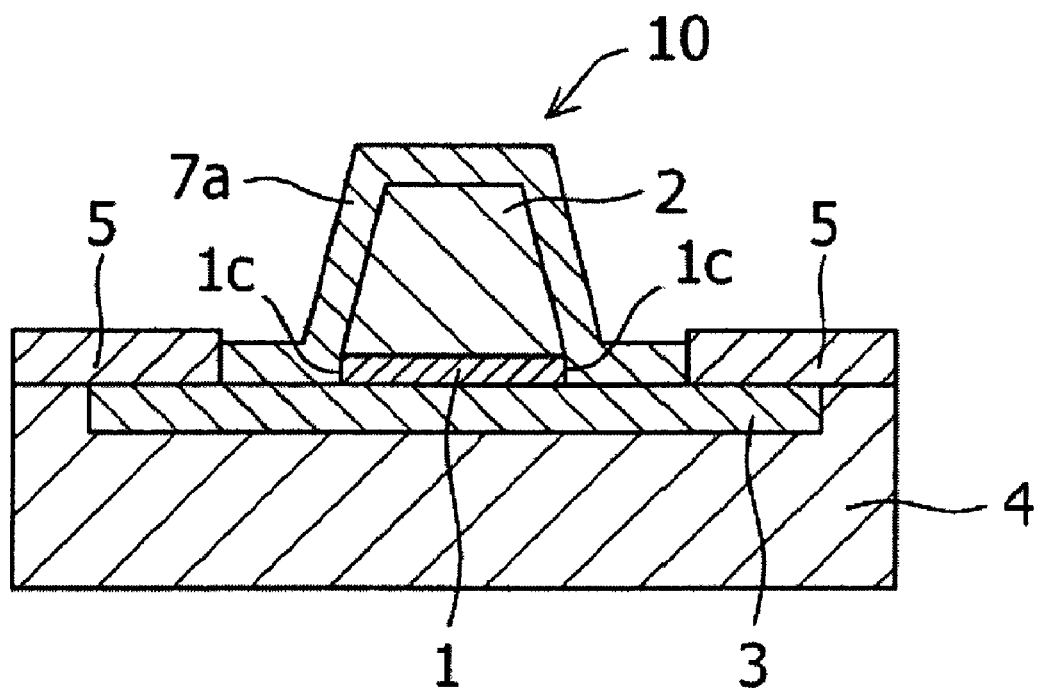
FIG. 7 is a cross-sectional view showing the configuration of the interconnection element according to another alternate embodiment.

FIG. 7 shows a fifth embodiment. In this embodiment, the interconnection element 10 is held by the substrate 4. At least the periphery 1c of the tin metal layer (LMP metal layer) 1 may be covered with a protection layer 7a, which differs from the structure of the first embodiment (FIG. 1), which does not use such a layer. As the material for the protection layer 7a, a metal having a high melting point may be selected. Such a metal includes copper, nickel, gold, and a laminated body of nickel-gold. The thickness of this protection layer 7a may be, for example, 0.5 µm to 30 µm. The protection layer 7a can be produced by, for example, electrolytic plating or electroless plating although its production is not restricted to any particular method. This structure is achieved in the following ways. First, the protection layer 7a is formed when the structure of FIG. 3F is obtained. Alternatively, the protection layer 7a may be formed when the periphery 1c of the tin metal layer 1 is not covered with the solder resist layer 5 in the structure of FIG. 3G. Alternatively, the protection layer 7a can be formed when the pad 3 in the structure of FIG. 3A is formed wider than the etching resist 6 in FIG. 3E, such that the periphery 1c of the tin metal layer 1 is exposed. The provision of the protection layer 7a allows the use of temperature conditions in which the tin metal layer 1 may melt when, for example, the interconnection element 10 is connected to another circuit or substrate by soldering. According to this embodiment, even under such conditions, the bump 2 never slips out or deflects significantly due to melting of the tin metal layer 1 because the protection layer 7a is provided, so that secure soldering is achieved. Furthermore, the copper on the face of the bump 2 can be protected from oxidation by the protection layer 7a, thereby increasing the height of the interconnection element 10.

In a sixth alternative embodiment, gallium-based metal may be used as a LMP metal layer instead of the tin metal layer. As the gallium-based metal, an alloy containing at least a metal selected from a group consisting of zinc, tin, indium, bismuth, copper, nickel, cobalt and gold may be used. Such an alloy can be constructed in the same structure as the structure of FIG. 2C using the conductive paste disclosed in Japanese Patent Application Publication No. 57-107501. At this time, depending on the composition of the conductive paste, it is permissible to join the copper foil 2a and the pad 3 with pressure by heating and by disposing the conductive paste.

The various examples described above can be combined to provide further embodiments. All of the U.S. patents, U.S. patent application publications, U.S. patent applications, foreign patents and foreign patent applications (including their U.S. counterparts), and non-patent publications referred to in this application or listed in the Application Data Sheet are incorporated herein by reference in their entirety. Aspects of the examples can be modified, if necessary to employ concepts of the various patents, applications and publications to provide yet further examples.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An interconnection element comprising:
a plurality of metal conductors;
a plurality of solid metal bumps overlying and projecting in a first direction away from respective ones of the conductors, each bump having at least one edge bounding the bump in at least a second direction transverse to the first direction; and
a low melting point (LMP) metal layer having a first face joined to the respective ones of the conductors and bounded in the second direction by at least one edge and a second face joined to the bumps,
wherein the edges of the bumps and the LMP layer are aligned in the first direction, and
wherein the LMP metal layer has a melting temperature substantially lower than the conductors.

2. The interconnection element of claim 1, further comprising a dielectric element extending in the second direction and in a third direction transverse to the first direction, wherein the plurality of metal conductors extend in the second and third directions.

3. The interconnection element of claim 2, further comprising a circuit panel having conductive pads, the metal bumps being joined to the conductive pads of the circuit panel.

4. The interconnection element of claim 3, wherein the circuit panel is a printed circuit board.

5. The interconnection element of claim 1, wherein the LMP metal layer is selected from the tin metal group consisting of tin, tin-copper, tin-lead, tin-zinc, tin-bismuth, tin-indium, tin-silver-copper, tin-zinc-bismuth, and tin-silver-indium-bismuth.

6. The interconnection element of claim 1, wherein the LMP metal layer is comprised of a gallium series metal including gallium and a metal selected from the group consisting of zinc, tin, indium, bismuth, copper, nickel, cobalt, and gold.

7. The interconnection element of claim 1, wherein the bumps are capable of being electrically connected to a separate printed circuit board or an electronic circuit component, and wherein the melting temperature of the LMP metal layer is not reached during connection of the bumps to the separate printed circuit board or electronic circuit component.

8. The interconnection element of claim 1, further comprising a protection layer overlying the metal bumps and a metal connection contacting the bump so as to provide for electrical connection to a circuit panel or an electronic circuit component,
wherein the metal connection is capable of being reflowed, and wherein the LMP metal layer has a first melting point capable of melting during the reflow process, and wherein the protection layer has a second melting point greater than the melting point of the LMP metal layer.

9. The interconnection element according to claim 8, wherein the metal connection is a solder connection including a solder ball disposed to cover at least a part of the bumps.

10. The interconnection element of claim 1, further comprising a dielectric element underlying the metal conductors and at least a portion of the LMP metal layer.

11. The interconnection element of claim 1, wherein the LMP metal layer is comprised of copper and includes first and second faces and a plurality of layers or portions of variable compositions extending between the first and second faces, and wherein at least one of the plurality of layers or portions has a higher copper concentration than a layer positioned adjacent thereto.

12. The interconnection element of claim 1, further comprising a microelectronic element connected to the interconnection element, the microelectronic element having first and second outer edges, an encapsulant joined to the microelectronic element extending beyond the first and second outer edges, and a via extending through a portion of the encapsulant adjacent the first or the second edge of the chip.

13. The interconnection element of claim 12, wherein the via further includes a plated through hole.

14. A microelectronic assembly comprising:
  a first substrate having a first surface;
  a first thin conductive element exposed on the first surface and having a first face;
  a first conductive projection having a base defining a first area and connected to the first face, the projection extending to an end remote from the first face and defining a second area that is less than the first area, a side wall being defined between the base and the end and constantly tapering in a direction from the base to the end;
  a dielectric material layer having a second surface and a third surface remote from the second surface, the second surface extending along the first surface of the first substrate, the dielectric material layer having a first opening formed therein, the first opening having a periphery; and
  a first solder mass formed on the first conductive projection, extending along the end and a portion of the side wall to a location disposed between the base and the end;
  wherein the first conductive projection extends through the first opening such that the periphery thereof contacts a portion of the side wall, and the solder mass extends towards the third surface of the dielectric material layer.

15. The microelectronic assembly of claim 14, wherein the first solder mass contacts the dielectric material layer.

16. The microelectronic assembly of claim 14, wherein the first conductive projection includes a bond layer and a solid metal layer, the solid metal layer defining the end of the first conductive projection, and the bond layer including a conductive bond material, defining the base of the first conductive projection, and providing an electrically conductive interconnect between the first thin conductive element and the solid metal layer.

17. The microelectronic assembly of claim 14, wherein the first thin conductive element is a pad.

18. The microelectronic assembly of claim 17, further including a trace electronically connected to the pad.

19. The microelectronic assembly of claim 14, wherein at least one of the first conductive posts includes a base metal layer and a top metal layer overlying the base metal layer, the top metal layer forming the end surface and at least a portion of the side wall thereof.

20. The microelectronic assembly of claim 19, wherein the dielectric material layer contacts at least a portion of the top metal layer.

21. The microelectronic assembly of claim 14, wherein the dielectric material layer has a thickness defined between the second and third surfaces, and wherein the first opening defines an inside surface extending through the thickness of the dielectric material layer and including the periphery, the inside surface contacting a portion of the side wall of the first conductive projection.

22. The microelectronic assembly of claim 21, wherein the first conductive post is divided into a first portion and a second portion, the first portion being defined within the thickness of the dielectric material layer and including the base, and the second portion being disposed outside of the thickness of the dielectric material layer and including the end.

23. The microelectronic assembly of claim 14, wherein the first thin conductive element, the first conductive post and the first solder mass together define a first interconnect element, and wherein the dielectric material layer includes a plurality of openings substantially similar in structure to the first opening, the assembly further including a plurality of interconnect elements substantially similar in structure to the first interconnect element, wherein the conductive projections thereof extend through corresponding openings such that the peripheries thereof contact portions of the side walls of the projections, and wherein the edges of the solder masses extend toward the third surfaces of the dielectric material layer.

24. The microelectronic assembly of claim 23, wherein at least one of the bases of the first metal posts is connected to a respective one of the conductive pads by a layer of conductive metal.

25. A component, comprising:
  a substrate having a first surface;
  a conductive pad exposed at the first surface;
  a conductive post having a first portion formed of at least one of copper or copper alloy overlying a portion of the conductive pad, and having a second portion connecting the first portion with the conductive pad, the first portion of the conductive post having an end remote from the conductive pad and a sidewall extending from the end towards the conductive pad, wherein the second portion does not extend beyond the first portion in directions along the first surface;
  a dielectric material layer overlying the substrate and contacting the sidewall of the conductive post, the dielectric material layer having a second surface at a height above the first surface, wherein the dielectric material layer contacts the first and second portions of the conductive post; and
  a conductive mass joined to the end of the conductive post and contacting the sidewall above the second surface of the dielectric material layer.

26. The component of claim 25, wherein the second portion is formed of a low melting point metal.

27. The component of claim 25, wherein the first solder mass contacts the dielectric material layer.

28. A component, comprising:
  a substrate having a first surface;
  a conductive pad exposed at the first surface;
  a conductive post having a first portion having a first melting point overlying a portion of the conductive pad, and having a second portion having a second melting point lower than the first melting point connecting the first portion with the conductive pad, the first portion of the conductive post having an end remote from the conductive pad and a sidewall extending from the end towards the conductive pad, wherein the second portion does not extend beyond the first portion in directions along the first surface;
  a dielectric material layer overlying the substrate and contacting the sidewall of the conductive post, the dielectric material layer having a second surface at a height above the first surface, wherein the dielectric material layer contacts the first and second portions of the conductive post; and
  a conductive mass joined to the end of the conductive post and contacting the sidewall above the second surface of the dielectric material layer.

29. The component of claim 28, wherein the second portion of the conductive post is of a low melting point metal selected from the tin metal group consisting of tin, tin-copper, tin-lead, tin-zinc, tin-bismuth, tin-indium, tin-silver-copper, tin-zinc-bismuth, and tin-silver-indium-bismuth.

30. The component of claim 28, wherein the second portion of the conductive post is of a low melting point metal that is comprised of a gallium series metal including gallium and a metal selected from the group consisting of zinc, tin, indium, bismuth, copper, nickel, cobalt, and gold.

31. The component of claim 28, wherein the conductive mass contacts the dielectric material layer.

* * * * *